United States Patent [19]

Itou et al.

[11] Patent Number: 4,984,259
[45] Date of Patent: Jan. 8, 1991

[54] X-RAY EXPOSURE APPARATUS

[75] Inventors: Masaaki Itou, Higashimurayama; Shigeo Moriyama, Tama, both of Japan

[73] Assignee: Hitachi, Ltd., Tokyo, Japan

[21] Appl. No.: 481,682

[22] Filed: Feb. 20, 1990

Related U.S. Application Data

[63] Continuation of Ser. No. 253,559, Oct. 5, 1988, abandoned.

[30] Foreign Application Priority Data

Oct. 9, 1987 [JP] Japan ................... 62-253637

[51] Int. Cl.$^5$ ............................. G21K 5/10
[52] U.S. Cl. ................. 378/146; 378/34; 378/145
[58] Field of Search ............. 378/34, 145, 146, 84

[56] References Cited

U.S. PATENT DOCUMENTS 4,514,857 4/1985 Kimura et al. ............... 378/34
4,625,323 11/1986 O'Kaya ...................... 378/145
4,803,713 2/1989 Fujii ........................ 378/34

FOREIGN PATENT DOCUMENTS 60-226122 11/1985 Japan.
61-276223 12/1986 Japan.

OTHER PUBLICATIONS

"X-Ray Lithography and Applications of Soft X Rays to Technology" Alan Wilson, Proceedings of SPIE, Oct. 1983, vol. 448, pp. 93–101.

Primary Examiner—Craig E. Church
Attorney, Agent, or Firm—Antonelli, Terry, Stout & Kraus

[57] ABSTRACT

An X-ray exposure apparatus comprises an X-ray source, a reflecting mirror for deflecting an X-ray beam radiated from the X-ray source to an object, and mechanisms for rotating the reflecting mirror about an axis of rotation apart from a reflecting surface of the reflecting mirror. The reflecting mirror has such a shape that the angle of incidence remains constant relative to the X-ray beam at given angles of rotation.

6 Claims, 5 Drawing Sheets

F I G. 1
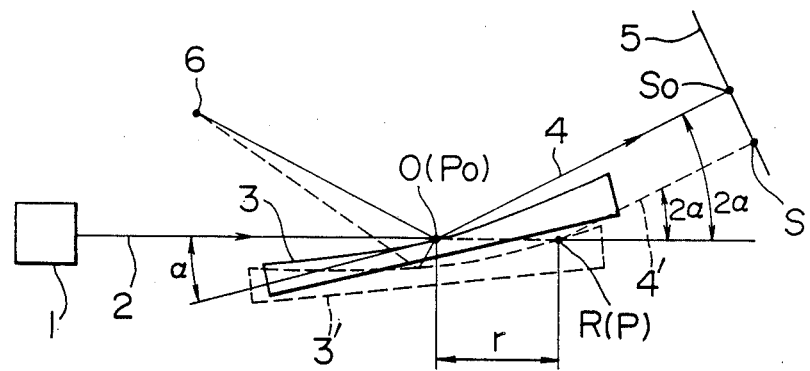
F I G. 2A
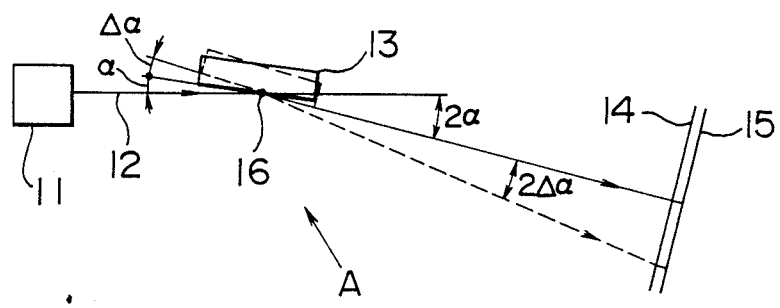
F I G. 2B
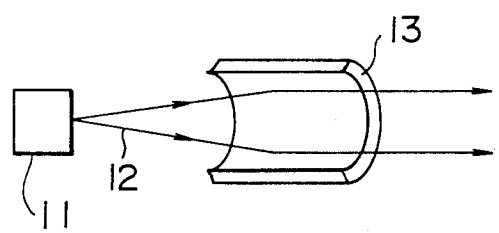

F I G. 6
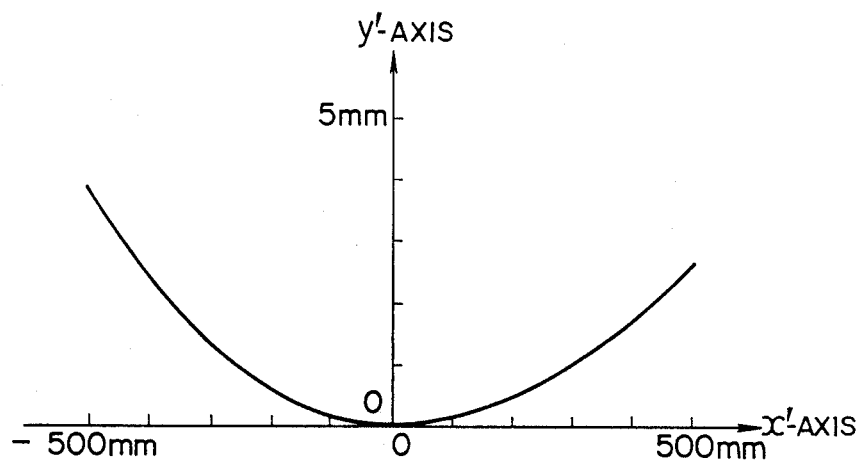
F I G. 7
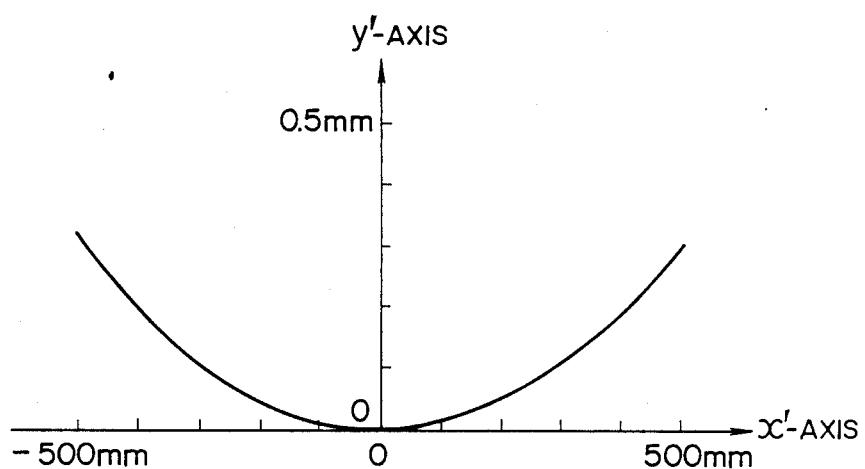

X-RAY EXPOSURE APPARATUS

This application is a continuation of application Ser. No. 07/253,559, filed Oct. 5, 1988, now abandoned.

BACKGROUND OF THE INVENTION

The present invention relates to an X-ray exposure apparatus for printing a fine pattern such as a semiconductor integrated circuit pattern or the like. More particularly, the invention is concerned with an optical system including a reflecting mirror and suited advantageously for scanning an object with an X-ray beam in an X-ray exposure apparatus which uses synchrotron radiation as a source.

In recent years, synchrotron radiation (hereinafter abridged to SR) becomes a promising source for the X-ray exposure apparatus. The SR is electromagnetic radiation generated by high energy electrons which run along a circular orbit at a velocity close to that of light. The SR is emitted in the direction tangential to the orbit and features excellent directivity and high intensity in the wavelength range of about 0.5 to 1.5 nm usually used in the X-ray exposure apparatus. It is however observed that although the SR is emitted within an angular range of several tens milliradians in the horizontal plane (orbital plane of electrons), the divergence angle of the component whose wavelength is useful for the X-ray exposure is at most 1 milliradian in a vertical plane (the plane extending orthogonally to the orbital plane and in parallel to the plane of the drawing in the following description). Accordingly, in order to expose a fixed object placed at several to ten meters from the SR light source over a square field having a side of several tens millimeters, the object must be scanned in the vertical direction of deflecting the SR.

To this end, a rotatable reflecting mirror is used in a SR beam scanning system known heretofore, as disclosed in "Proceeding of SPIE - The International Society for Optical Engineering", Vol. 448, pp. 93-101. FIG. 2A of the accompanying drawings shows an arrangement of this known optical system in a plane orthogonal to the orbital plane of electrons. The beam 12 emitted from a SR source 11 is deflected by a reflecting mirror 13 to a mask 14 and a wafer 15 held with a gap of several tens μm therebetween, whereby the pattern of the mask is printed on the wafer 15. For convenience' sake, the combination of the mask and the wafer will collectively be termed an object in the following description. The reflecting surface of the mirror 13 is implemented in a cylindrical form ("U" form) to collimate the in the horizontal direction, as illustrated in FIG. 2B, wherein the mirror 13 is so placed that the center axis of the cylindrical surface lies in the plane parallel to that of the drawing, as viewed in FIG. 2A. The reflecting mirror can be rotated about, the axis 16 extending perpendicularly to the plane of the drawing within an angular range $\Delta\alpha$ of about $\pm 3$ mrad relative to the center position where the grazing incidence angle $\alpha$ (i.e. angle formed between the incident beam and the reflecting surface) is 24 mrad. As a result, the object located at about 7 m from the reflecting mirror is scanned with the beam over a width of about 40 mm. On the other hand, in the horizontal plane (orthogonal to the plane of the drawing), the SR beam is collimated by a concave reflecting surface, whereby a beam width of about 40 mm is obtained on the object.

In another scanning system known heretofore, the reflecting mirror is translated (i.e. moved parallelwise), as disclosed in JP-A-60-226122 filed in the name of the present assignee and laid open on Nov. 11, 1985 and JP-A-61-276223 filed in the name of Fujitsu, Ltd. and laid open on Dec. 6, 1986. More specifically, in the case of this known scanning system illustrated in FIGS. 3A and 3B of the accompanying drawings, a reflecting mirror 23 is moved in the same direction as the direction in which a SR beam 22 radiated from the source 21 travels and the direction perpendicular thereto for allowing an object 24 to be scanned with the beam. The reflecting mirror surface is implemented in a cylindrical form ("U" form), as is illustrated in FIG. 2B, the center axis of which lies in the plane parallel to that of the drawing.

In the first mentioned prior art, the angle of incidence at the reflecting mirror varies by $\Delta\alpha$ during the scanning operation. In this connection, it should be however noted that in general the reflectivity, in the soft X-ray region varies significant by dependence with the angle of incidence. As a consequence, the beam intensity varies along with the position on the object, giving rise to a first problem that line width control in the resist pattern becomes difficult. Additionally, the direction of the incident beam on the object varies within the range of $2\Delta\alpha$, involving a second problem that the printed pattern undergoes distortion when compared with the exposure using collimated beam. The first mentioned problem may be solved by controlling the rotating speed of the reflecting mirror as a function of the angle of incidence so that the uniform illumination is obtained. However, in view of the fact that the reflectivity varies with time due to contamination on the reflecting surface, the uniform illumination can not always be assured. Besides, the second mentioned problem still remains unsolved.

With the second mentioned prior art system, it is certainly possible to make constant both the beam intensity and the incident direction over the object. However, a greater difficulty will be encountered in implementing a translation mechanism with the grazing incidence angle being kept constant, as compared with the mechanism for the rotational scanning.

SUMMARY OF THE INVENTION

An object of the present invention is to provide a beam scanning system for an X-ray exposure apparatus in which the beam intensity and the incident direction on the object can always be held constant in the course of scanning of an object with a SR beam by means of a simple rotating mechanism.

The above object can be accomplished by providing a beam scanning system for an X-ray exposure apparatus, disposed apart from a reflecting surface of the rotating mirror beam emitted from an X-ray source to an object, and a mechanism for rotating the reflecting mirror about an axis extending orthogonally to the incident plane of the X-ray the reflecting mirror being implemented in such shape that the incidence angle of the X-ray beam always remains constant over a given angle of rotation, wherein the object is scanned with the X-ray beam by rotating the reflecting mirror.

According to the teachings of the invention, the scanning of an object with the X-ray beam can be accomplished with the beam intensity and the incident direction being maintained constant with the aid of the rotating mechanism of a simple structure, whereby simplification of the exposure apparatus as well as enhanced accuracy in the printed pattern can be attained to great advantage.

BRIEF DESCRIPTION OF THE DRAWINGS

FIG. 1 is a schematic side view for illustrating the principle underlying the beam scanning system according to the present invention;

FIG. 2A is a schematic side view of a beam scanning system known heretofore;

FIG. 2B is a view taken in the direction indicated by an arrow A in FIG. 2A and shows a shape of a reflecting surface for collimating a diverging X-ray beam in the orbital plane of electrons;

FIG. 6 is a diagram showing the shape of the reflecting mirror surface in the embodiment shown in FIG. 5.

FIG. 7 is a diagram showing the shape of the reflecting mirror surface according to the invention.

DESCRIPTION OF THE PREFERRED EMBODIMENTS

Figure 3A:
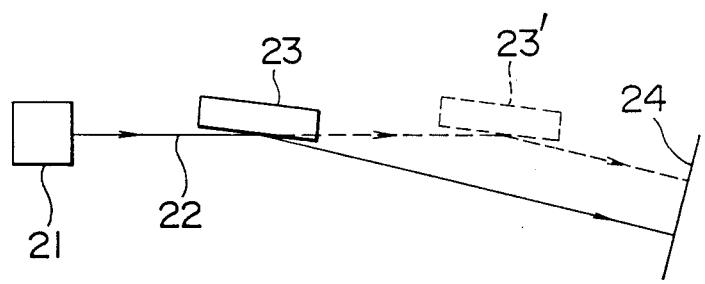
FIGS. 3A and 3B are schematic side views showing another beam scanning system known heretofore.
Figure 3B:
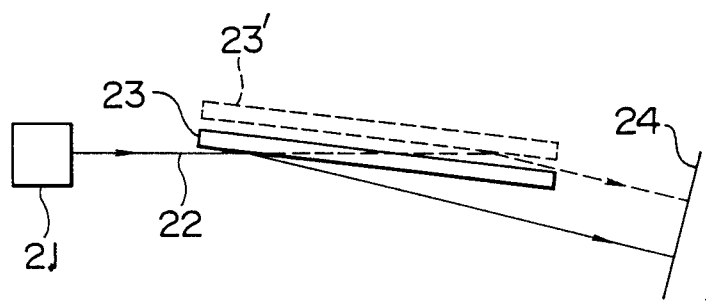

In the first place, the principle underlying the beam scanning system according to the present invention will be elucidated by reference to FIG. 1. The X-ray beam 2 radiated from a source 1 is incident on a reflecting mirror 3 at the point $P_o$ (corresponding to the point 0 in the spatial coordinate system) with a grazing incidence angle $\alpha$ (the angle formed between the incident X-ray beam and a line tangential to the mirror surface at the incident point $P_o$), whereby the X-ray beam 4 reflected by the mirror 3 reaches a point $S_o$ on an object 5. Starting from this state, the reflecting mirror 3 is rotated about a center axis 6 of rotation by a given angle so that the reflecting mirror 3 assumes a position 3' indicated by a broken line. Then, the X-ray beam 2 is incident on the reflecting mirror 3 at a point P which corresponds to a point R in the spatial coordinate system and which is spaced from the point 0 by a distance r. In this conjunction, it is to be noted that the reflecting mirror surface is contoured in the shape such that the grazing incidence angle $\alpha$ holds the same value, as will be made apparent later on. Consequently, the reflected X-ray beam 4' is deflected to the same direction as the light beam 4 to impinge on the object 5 at a point S which is distanced from the point $S_o$ by $r \cdot \sin 2\alpha$. Thus, it will be seen that the object 5 can be scanned with the X-ray beam 2 by rotating the reflecting mirror 3 with the angle of incidence being maintained constant.

Figure 4:
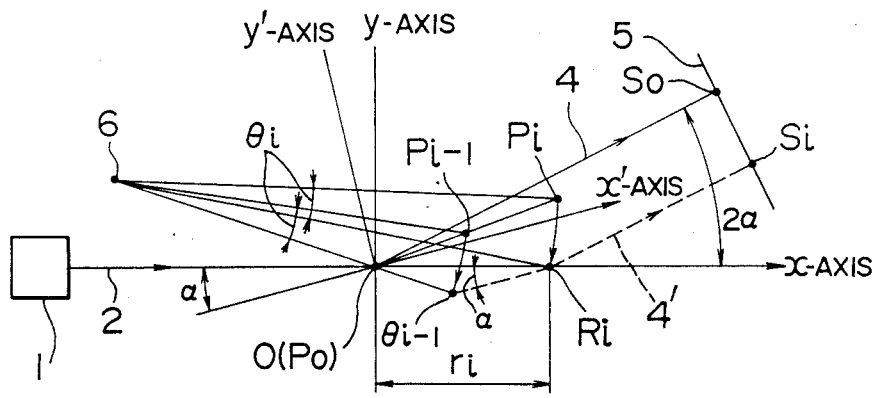
FIG. 4 is a schematic side view for illustrating a procedure of determining the shape of the reflecting mirror surface according to the teachings of the invention.

Next, a procedure for determining the shape of the reflecting mirror surface capable of realizing the scanning operation described above will be explained by referring to FIG. 4, in which like items as those shown in FIG. 1 are designated by the same reference characters. It is assumed that the spatial coordinate system consists of the origin coinciding with the point 0 on the X-ray beam 2, the x-axis taken along a straight line coinciding with the beam 2 and the y-axis coinciding with a straight line intersecting the x-axis orthogonally thereto at the origin 0. Further, a mirror-associated coordinate system is so established that the origin is located at the point $P_o$, the x'-axis coincides with the line tangential to the reflecting mirror surface at the point $P_o$ and that the y'-axis coincides with a line normal to the reflecting mirror surface at the point $P_o$. Thus, it will be seen that rotation of the reflecting mirror 3 about the axis of rotation 6 extending perpendicularly to the plane of the drawing brings about displacement of the origin $P_o$ of the mirror coordinate system relative to the spatial coordinate system. The points 0 and $P_o$ defining the origins of both coordinate systems, respectively, coincide with each other only at a definite rotational (angular) position of the reflecting mirror.

Now, let's represent two points located very closely to each other by $P_{i-1}$ and $P_i$, respectively, while considering that a line segment $P_{i-1}P_i$ constitutes a part of the reflecting mirror surface. It is assumed that when the mirror is rotated clockwise about the center axis 6 of rotation by an angle $\theta_i$, the points $P_{i-1}$ and $P_i$ are moved to points $Q_{i-1}$ and $R_i$, respectively, in the spatial coordinate system, wherein the coordinates of the point $P_{i-1}$ and $P_i$ in the mirror coordinate system are represented by $(x'_{Pi-1}, y'_{Pi-1})$ and $(x'_{Pi}, Y'_{Pi})$, respectively, while the coordinates of the points $Q_{i-1}$ and $R_i$ in the spatial coordinate system are represented by $(x_{Qi-1}, Y_{Qi-1})$ and $(x_{Ri}, y_{Ri})$, respectively. Then, relations given by the following expressions (1) to (4) apply valid.

$$x_{Qi-1} = (x'_{Pi-1} \cos\alpha - y'_{Pi-1} \sin\alpha - x_c)\cos\theta_i + \quad (1)$$
$$(y'_{Pi-1} \cos\alpha + x'_{Pi-1} \sin\alpha - y_c)\sin\theta_i + x_c,$$

$$y_{Qi-1} = (y'_{Pi-1} \cos\alpha + x'_{Pi-1} \sin\alpha - y_c)\cos\theta_i - \quad (2)$$
$$(x'_{Pi-1} \cos\alpha - y'_{Pi-1} \sin\alpha - x_c)\sin\theta_i + y_c,$$

$$x'_{Pi} = \{(x_{Ri} - x_c)\cos\theta_i - (y_{Ri} - y_c)\sin\theta_i + x_c\}\cos\alpha + \quad (3)$$
$$\{(y_{Ri} - y_c)\cos\theta_i + (x_{Ri} - x_c)\sin\theta_i + y_c\}\sin\alpha,$$

$$y'_{Pi} = \{(y_{Ri} - y_c)\cos\theta_i + (x_{Ri} - x_c)\sin\theta_i + y_c\}\cos\alpha - \quad (4)$$
$$\{(x_{Ri} - x_c)\cos\theta_i - (y_{Ri} - y_c)\sin\theta_i + x_c\}\sin\alpha,$$

where $(x_c, y_c)$ represents the coordinates of the rotational center axis 6 of the mirror in the spatial coordinate system.

The conditions for the point $R_i$ to coincide with a point $(r_i, O)$ on the x-axis and for the line segment $Q_{i-1}R_i$ to form the angle $\alpha$ relative to the x-axis are given by the following expressions (5), (6) and (7):

$$x_{Ri} = r_i, \ldots \quad (5)$$

$$y_{Ri} = 0, \ldots \quad (6)$$

$$\tan\alpha = \frac{y_{Ri} - y_{Qi-1}}{x_{Ri} - x_{Qi-1}}. \quad (7)$$

Accordingly, if the quantities $\alpha$, $r_i$, $(x_c, y_c)$ and $(x'_{Pi-1}, y'_{Pi-1})$ are known and when the angle $\theta_i$ is very small, then, from the expressions (1), (2), (5), (6) and (7), the angle $\theta_i$ can be given by the following expression (8):

$$A\theta_i^2 + B\theta_i + C = 0, \ldots \quad (8)$$

where coefficients A, B and C are expressed as follows:

$$A = \frac{1}{2}(y_c\cos\alpha - x_c\sin\alpha - y'_{Pi-1}), \ldots \quad (9)$$

$$B = x_c \cos\alpha + y_c \sin\alpha - x'_{Pi-1}, \quad \ldots \ldots \quad (10)$$

$$C = r_i \sin\alpha + y'_{Pi-1}, \quad \ldots \ldots \quad (11)$$

It will thus be seen that when $\theta_i$ is determined, the coordinates $(x'_{Pi}, y'_{Pi})$ can be determined using the expressions (3) and (4).

Thus, when $\theta_i$ and $(x'_{Pi}, y'_{Pi})$ are determined as described above, the X-ray beam 2 is incident on the mirror surface with the grazing incidence angle $\alpha$ at the point $P_i$ which is distanced from the point O by $r_i$. As the result of this, the reflected light beam 4' is deflected to the same direction as that of the beam 4 to impinge on the object 5 at a point $S_i$ distanced from the point $S_o$ by $r_i \cdot \sin 2\alpha$.

Now, the shape of the whole reflecting mirror surface can be determined in the manner mentioned below. First, the incidence angle $\alpha$ and the center axis of rotation $(x_c, y_c)$ are established appropriately. Subsequently, the coordinates $(x'_{Pi}, y'_{Pi})$ of a point on the reflecting mirror surface distanced from the origin $P_o(X'_{Po}=0, Y'_{Po}=0)$ by a very small length are determined by placing $i=1$ and $r_1=\Delta r$. More specifically, with $i=1$, the coefficients A, B and C are first determined in accordance with the expressions (9), (10) and (11), since the grazing incidence angle $\alpha$ and the coordinates $x_c$ and $y_c$ have already been determined to assume the respective predetermined values. Thus, $\theta_1$ can be determined in accordance with the expression (8). With $\theta_1$ having been determined, the coordinate $x'_{P1}$ and $y'_{P1}$ can be determined from the expressions (3) and (4), respectively.

Next, with reference to the coordinates $('_{P1}, y'_{P1})$ of the point $P_1$ thus determined, the coordinates $(x'_{P2}, y'_{P2})$ of a point $P_2$ distanced from the point $P_1$ by a very small length are determined through the same procedure as that for determining the point $P_1$ described above on the conditions that $i=2$ and $r_2=2 \cdot \Delta r$.

In this manner, the angles $\theta_i$ and the coordinates $(x'_{Pi}, Y'_{Pi})$ can be sequentially determined for $r_i = i \cdot \Delta r$ where $i=3,4\ldots, n$. Finally, the points $P_0, P_1, \ldots, P_n$ as determined are interconnected to define a smooth curve which represents the contour of the reflecting mirror surface. By giving the shape determined in this manner to the reflecting surface of the mirror 3, the grazing incidence angle $\alpha$ constantly assumes the same value so far as the rotation angle $\theta$ of the reflecting mirror is in the range of $0 \leq \theta \leq \theta_n$. Although the foregoing description has been made on the presumption that $x' > 0$, a similar beam scanning can of course be performed in the region in which $x' < 0$. In this case, on the conditions that $r_i = -i \cdot \Delta r$ (where $i=1, 2, 3, \ldots, n$), the coordinates for the envisaged mirror surface can be determined through the similar procedure as described above.

In practical application of the present invention, the reflecting mirror surface may also be configured in a concave form as viewed in FIG. 2B in a plane orthogonal to the x'y'-plane and parallel to the y'-axis. With the mirror imparted with the reflecting surface shaped in this manner, it is possible to collimate the beam radiated from the synchrotron source in a plane orthogonal to the xy-plane (i.e. the orbital plane of electrons in) for thereby obtaining the beam of a desired width on the object.

Figure 5:
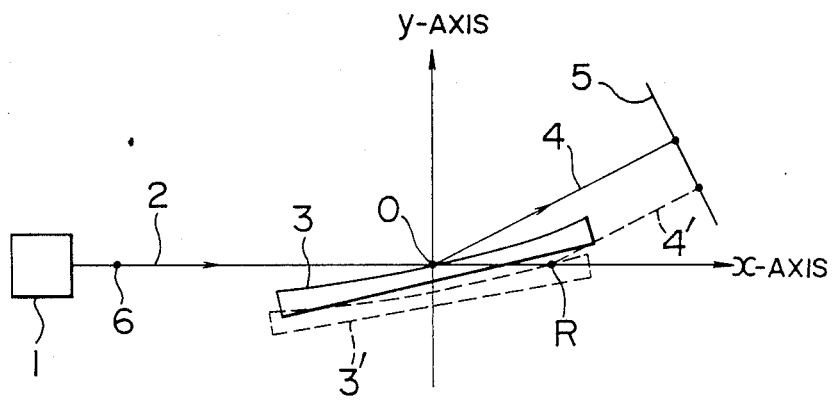
FIG. 5 is a schematic side view showing an exemplary embodiment of the invention.

Now, an exemplary embodiment of the present invention will be described by referring to FIG. 5 in which like reference characters as those used in FIG. 1 designate the same items. In the case of the instant embodiment, the grazing incidence angle $\alpha$ at the mirror 3 is set to 25 mrad. When gold is used for the reflecting surface material, there can be obtained a reflectance above 70% in the soft X-ray region. The center 6 of rotation is set on the x-axis (optical axis) at a position distanced from the point O by 1000 m toward the light source 1. In that case, the rotation of the mirror 3 within an angular range of $\pm 10$ mrad brings about movement of the reflection point R on the x-axis by 823 mm. As the consequence, the reflected X-ray beam scans the object 5 over a width of about 40 mm. The mirror surface is concave, as will be seen in FIG. 5. For allowing the beam to scan the object over the range mentioned above, the length of the mirror in the x'-direction must be of the order of 800 mm ($\pm 400$ mm). This size can readily be realized in practice.

In the foregoing description, the beam width of the SR in the vertical plane is regarded to be infinitesimal. However, the X-ray beam which is used for exposure are radiated within the angular range of about 1 mrad in the vertical plane. By collimating this diverging beam vertically and scanning with the direction of the reflected beam being maintained constant, there can be attained a high throughput and an enhanced printing accuracy. In general, in order to collimate the light beam radiated from a point light source, an off-axis paraboloidal mirror having the focal point coinciding with the point light source is used.

In the beam scanning system according to the present invention, the reflecting mirror can be made to approximate very closely the collimating off-axis paraboloidal mirror by setting the center of rotation of the reflecting mirror at the optimal position. Referring to FIG. 5, the distance between the source 1 and the point O is set to 5 m with the grazing incidence angle $\alpha$ being 25 mrad, by way of example. In that case, the center 6 of rotation is located at the position on the x-axis (optical axis) distanced from the point O by 10 m toward the source 1. Then, the reflecting surface is of such a shape as illustrated in FIG. 7. When the reflecting mirror 3 is rotated within the angular range of $\pm 1$ mrad, the reflection point R moves by about 800 mm on the x-axis, resulting in that the reflected beam 4 scans the object 5 over the width of about 40 mm. At that time, the diverging beam from the light source is well collimated to impinge onto the object regardless of the position of the reflection point R.

Figure 8:
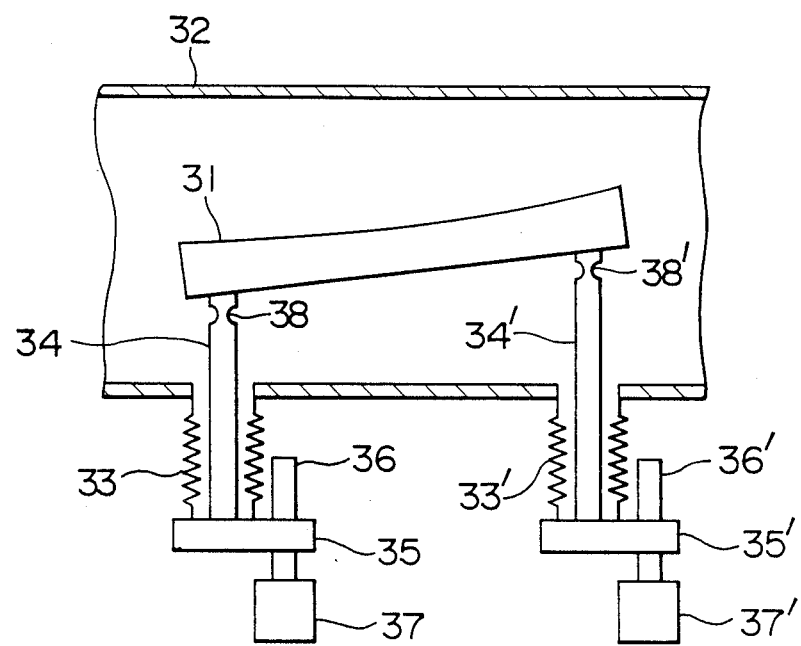
FIG. 8 is a schematic view showing a structure of a mechanism for rotating the reflecting mirror in the X-ray exposure apparatus according to an embodiment of the invention.

FIG. 8 shows a mechanical structure for rotating the reflecting mirror according to an embodiment of the invention. Referring to the figure, a pair of linear motion mechanisms constituted, respectively, by motors 37 and 37' and lead screws 36 and 36' are installed in the atmosphere. Female screw members 35 and 35' engaging threadwise the lead screws 36 and 36' have connecting rods 34 and 34' fastened thereto, respectively, which in turn support a reflecting mirror 31 through flexure hinges 38 and 38', respectively. The reflecting mirror and the connecting rods are placed in a vacuum chamber 32, wherein vacuum-tightness is ensured by bellows 33 and 33'. By controlling the movements of the lead screws coordinatively, desired rotation of the reflecting mirror can be accomplished.

We claim:

1. An X-ray exposure apparatus comprising:
an X-ray source;

a reflecting mirror having a reflecting surface for deflecting an X-ray beam radiated from said X-ray source to an object;

means for rotating said reflecting mirror having said reflecting surface about an axis of rotation, said axis of rotation being disposed apart from said reflecting surface;

said reflecting surface being configured with a shape so that an angle of grazing incidence of said X-ray beam is maintained at a constant value when said reflecting mirror rotates about said axis of rotation; and means for scanning said object with said X-ray beam by rotating said reflecting mirror about said axis of rotation by means of said rotating means.

2. An X-ray exposure apparatus according to claim 1, wherein said reflecting surface of said reflecting mirror defines at least approximately an off-axis paraboloidal surface, the focal point of which coincides with the position of said X-ray source.

3. An X-ray exposure apparatus according to claim 1, wherein said means for rotating said reflecting mirror is constituted by at least two linear motion mechanisms one of which supports said reflecting mirror at a portion thereof located near to said X-ray source through an elastic member, while the other linear motion mechanism supports said reflecting mirror at a portion thereof located near to said object through an elastic member, said linear motion mechanisms being driven separately from each other such that said reflecting mirror can undergo the same motion equivalent to the rotation about said axis of rotation.

4. An X-ray exposure apparatus according to claim 2, wherein said means for rotating said reflecting mirror is constituted by at least two linear motion mechanisms one of which supports said reflecting mirror at a portion thereof located near to said X-ray source through an elastic member, while the other linear motion mechanism supports said reflecting mirror at a portion thereof located near to said object through an elastic member, said linear motion mechanisms being driven separately from each other such that said reflecting mirror can undergo the same motion equivalent to the rotation about said axis of rotation.

5. An X-ray exposure apparatus comprising:

an X-ray source;

a reflecting mirror having a reflecting surface for deflecting an X-ray beam radiated from said X-ray source to an object, wherein the shape of said reflecting surface is configured by connecting points $P_0, P_1, P_3, P_3, \ldots P_i, \ldots P_n$, in an area of $x' > 0$, and points $P_0, P_{-1}, P_{-2}, P_{-3}, \ldots P_{-i}, \ldots P_{-n}$, in an area of $x' < 0$ smoothly in an $x'$-$y'$ coordinate system which points $P_i$ are defined in two coordinate systems so that one of the two coordinate systems is a rectangular coordinate system fixed to said reflecting surface in a plane including said X-ray beam which coordinate system has an origin $P_0$ on said reflecting surface, an $x'$ axis represented by a tangent at said origin $P_0$ and a $y'$ axis represented by a normal at said origin $P_0$, and the outer of the two coordinate systems is a rectangular coordinate system fixed to a space including a plane defined with said tangent at said origin $P_0$ and said X-ray beam having a grazing incidence angle of $\alpha$ with respect to said tangent, which coordinate system has said origin $P_0$ as an origin, an x axis represented by the same incident direction of said X-ray beam and a y axis represented by a direction perpendicular to said X-ray beam, and the center of rotation of said reflecting mirror is disposed apart from said reflecting surface and is represented as $(x_c, y_c)$ in said x-y coordinate system, and said origin $P_0$ is represented as $(0,0)$ in said $x'$-$y'$ coordinate system and coordinates $(x'_{Pi}, y'_{Pi})$ of said points $P_i$ are obtained by solving the following equation $$A\theta_i^2 + B\theta_i + C = 0$$

where $A = \tfrac{1}{2}(y_c\cos\alpha - x_c\sin\alpha - y'_{Pi-1})$ $B = x_c\cos\alpha + y_c\sin\alpha - x'_{Pi-1}$ $C = r_i\sin\alpha + y'_{Pi-1}$ $x'_{Pi} = \{(r_i - x_c)\cos\theta_i + y_c\sin\theta_i + x_c\}\cos\alpha + \{-y_c\cos\theta_i + (r_i - x_c)\sin\theta_i + y_c\}\sin\alpha$ $y'_{Pi} = \{-y_c\cos\theta_i - (r_i - x_c)\sin\theta_i + y_c\}\cos\alpha - \{(r_i - x_c)\cos\theta_i + y_c\sin\theta_i + x_c\}\sin\alpha$ $r_i = i \cdot \Delta r$ wherein $\Delta r$ represents a small distance, and the sign i is successively replaced as shown $i = 0, 1, 2, 3, \ldots, n$ and $i = -1, -2, -3, \ldots, -n$;

means for rotating said reflecting mirror having said reflecting surface about an axis of rotation extending perpendicular to the plane defined by said x-y coordinate system and passing through said coordinate $(x_c, y_c)$; and means for scanning said object with said X-ray beam by rotating said reflecting mirror by means of said rotating means.

6. An X-ray exposure apparatus comprising:

an X-ray source;

a reflecting mirror having an off-axis paraboloidal surface for deflecting an X-ray beam radiated from said X-ray source to an object;

means for rotating said reflecting mirror having said off-axis paraboloidal surface about an axis of rotation, said axis of rotation being disposed apart from said off-axis paraboloidal surface;

said off-axis paraboloidal surface being configured with a shape so that an angle of grazing incidence of said X-ray beam is maintained at a substantially constant value when said reflecting mirror rotates about said axis of rotation; and means for scanning said object with said X-ray beam by rotating said reflecting mirror about said axis of rotation by means of said rotating means.

* * * * *